(12) United States Patent
Kraus et al.

(10) Patent No.: US 11,313,888 B2
(45) Date of Patent: Apr. 26, 2022

(54) HOT SOCKET DETECTION AT AN ELECTRIC METER

(71) Applicant: Landis+Gyr Innovations, Inc., Alpharetta, GA (US)

(72) Inventors: Matthew E. Kraus, Jamestown, IN (US); Frank J. Boudreau, Jr., Otterbein, IN (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 140 days.

(21) Appl. No.: 16/836,629

(22) Filed: Mar. 31, 2020

(65) Prior Publication Data

US 2021/0302483 A1 Sep. 30, 2021

(51) Int. Cl.
| | |
|---|---|
| *G01R 31/00* | (2006.01) |
| *G01R 22/06* | (2006.01) |
| *G01R 22/10* | (2006.01) |
| *H01F 27/28* | (2006.01) |
| *H02K 3/28* | (2006.01) |

(52) U.S. Cl.
CPC ......... *G01R 22/068* (2013.01); *G01R 22/063* (2013.01); *G01R 22/10* (2013.01); *H01F 27/2823* (2013.01); *H02K 3/28* (2013.01)

(58) Field of Classification Search
USPC .................................................. 324/509, 142
See application file for complete search history.

(56) References Cited

U.S. PATENT DOCUMENTS

| | | | |
|---|---|---|---|
| 7,628,080 B1 * | 12/2009 | Feller | G01F 1/588 73/861.12 |
| 10,161,983 B2 | 12/2018 | Kraus et al. | |
| 10,371,739 B2 | 8/2019 | Voisine | |
| 2016/0327592 A1 * | 11/2016 | Hewson | H01F 27/2885 |
| 2017/0122995 A1 | 5/2017 | Voisine, Jr. | |
| 2018/0080970 A1 * | 3/2018 | Kraus | G01R 22/068 |
| 2019/0120885 A1 | 4/2019 | Kraus et al. | |
| 2019/0391198 A1 | 12/2019 | Minich et al. | |

FOREIGN PATENT DOCUMENTS

WO 2018/057724 A1 3/2018

OTHER PUBLICATIONS

PCT Patent Application No. PCT/US2021/024032, International Search Report and Written Opinion, dated Jul. 6, 2021, 12 pages.

* cited by examiner

*Primary Examiner* — Vincent Q Nguyen
(74) *Attorney, Agent, or Firm* — Kilpatrick Townsend & Stockton LLP

(57) ABSTRACT

Techniques for hot socket detection are disclosed. In an example, a meter includes a current transformer with a secondary bifilar winding. The meter is in proximity to a current coil. The secondary bifilar winding includes a first bifilar winding and a second bifilar winding. A start lead of the first bifilar winding is connected to a start lead of the second bifilar winding. The meter further includes a voltage source configured to generate a direct current (DC) voltage signal. The DC voltage signal is provided to a finish lead of the first bifilar winding. A first sense resistor is connected between a finish lead of the second bifilar winding and ground. A processing circuit receives a signal indicating a voltage across the first sense resistor and determines a temperature associated with the current coil. The processing circuit is further configured to detect a hot socket condition based on the temperature.

19 Claims, 6 Drawing Sheets

HOT SOCKET DETECTION AT AN ELECTRIC METER

TECHNICAL FIELD

This invention relates generally to electric meters and more specifically to systems and methods for detecting a hot socket in an electric meter.

BACKGROUND

Electricity meters measure energy or power consumption between a utility power line and a load. For example, an electricity meter for a residential customer is often connected at a point at which the electrical system of the residence connects to the utility line. Utility meters include one or more electrical contacts across which a significant amount of current flows. For example, meters can have blades that connect to the power line and the load to enable the measurement of load current and load voltage from within the meter. The blades are received by the jaws of a meter mounting device for the building.

If the meter is to be replaced or repaired, the meter may be pulled out of the mounting device, and hence the blades out of the jaws. Although the blades and jaws are usually mechanically robust, they are nevertheless subject to wear and possibly corrosion. This is particularly the case if the meter has been removed or replaced several times. If wear on the jaws is significant, or if the jaws have corrosion, then there is a possibility of introducing a non-trivial resistance at the jaw-blade connection, which is undesirable.

A "hot socket" condition may occur when the connection between the jaws of the meter mounting device and the blades of the meter becomes less reliable due to increased resistance, arching, or other conditions. When a hot socket condition exists, the temperature of the meter and in particular, the temperature of the blades increases.

Further, a meter may have one or more switches that allow for disconnection of electrical service to a load. For example, many meters allow for remote control of the switches. Such switches necessarily must have substantial contacts because they carry the entire current of the load when the switch is closed. If these switches are used with some frequency, then there is a potential for degradation. Degradation of the switch contacts increases the resistance over the switch contacts. Such resistance creates additional power loss within the meter, which is undesirable.

Because it is undesirable to introduce resistance, there is a need for a way to detect possible degradation of such connections over time.

SUMMARY

Certain aspects and features include techniques for detecting a hot socket. In an example, a meter includes a current transformer that includes a primary winding, a secondary winding and a secondary bifilar winding. The primary winding corresponds to a current coil and the secondary bifilar winding includes a first bifilar winding and a second bifilar winding connected in series. A start lead of the first bifilar winding is connected to a start lead of the second bifilar winding. The meter further includes a voltage source configured to generate a direct current (DC) voltage signal. The DC voltage signal is provided to a finish lead of the first bifilar winding. A first sense resistor is connected between a finish lead of the second bifilar winding and ground. A temperature coefficient of the first sense resistor is less than a temperature coefficient of a resistivity of a material of the first bifilar winding and the second bifilar winding. The meter further includes a processing circuit that is configured to receive an input that corresponds to a voltage across the first sense resistor. The processing circuit is configured to use the voltage across the first sense resistor to determine a temperature associated with the current coil. The processing circuit is further configured to, when the temperature exceeds a temperature threshold, detect a hot socket condition.

In another example, a meter includes a current transformer. The current transformer includes a primary winding, a secondary winding and a secondary bifilar winding. The primary winding corresponds to a current coil and the secondary bifilar winding includes a first bifilar winding and a second bifilar winding connected in parallel. A finish lead of the first bifilar winding is connected to a start lead of the second bifilar winding. The meter further includes a voltage source configured to generate a DC voltage signal. The DC voltage signal is provided to the finish lead of the first bifilar winding and the start lead of the second bifilar winding, a first sense resistor connected between a start lead of the first bifilar winding and a finish lead of the second bifilar winding and ground. A temperature coefficient of the first sense resistor is less than a temperature coefficient of a resistivity of a material of the first bifilar winding and the second bifilar winding. The meter further includes a processing circuit that is configured to receive an input that corresponds to a voltage across the first sense resistor. The processing circuit is configured to use the voltage across the first sense resistor to determine a temperature associated with the current coil. The processing circuit is further configured to, when the temperature exceeds a temperature threshold, detect a hot socket condition.

In yet another example, a meter includes a current transformer. The current transformer includes a primary winding, a secondary winding, and a secondary bifilar winding. The primary winding corresponds to a current coil. The secondary bifilar winding includes a first bifilar winding and a second bifilar winding. A start lead of the first bifilar winding is connected to a start lead of the second bifilar winding. The meter further includes a voltage source configured to generate a DC voltage signal. The DC voltage signal is provided to a finish lead of the first bifilar winding. The meter further includes a first sense resistor connected between a finish lead of the second bifilar winding and ground. A temperature coefficient of the first sense resistor is less than a temperature coefficient of a resistivity of a material of the first bifilar winding and the second bifilar winding. The meter further includes an A/D converter connected between the first sense resistor and an input of a processing circuit. The processing circuit is configured to receive a signal from the A/D converter that corresponds to a voltage across the first sense resistor, use the signal from the A/D converter to determine a temperature associated with the current coil, and when the temperature exceeds a temperature threshold, detect a hot socket condition.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Aspects of the present disclosure relate to detecting a hot socket in an electric meter. A hot socket refers to a condition in which components, e.g., current-carrying blades, of an electric meter or jaws of a socket, are worn or damaged, causing a potentially dangerous temperature increase within the electric meter. A hot socket can occur when the jaws, blades or current coil become degraded over time.

Previous solutions for detecting a hot socket include adding a temperature sensor to the meter or using a modified current transformer with an additional secondary winding. The additional secondary winding is biased by a voltage, causing a current to form that is in part indicative of a permeability of the transformer. The permeability of the transformer is dependent on temperature, therefore a temperature is derived therefrom. But in this solution, a bias voltage must be applied intermittently to minimize a net magnetization by the winding and to preserve current sensor accuracy. This results in less frequent temperature measurements and may impact the accuracy of the current measurements.

In contrast, aspects of the present disclosure obtain temperature measurements by biasing an auxiliary bifilar winding around a core of a transformer that is placed in proximity to the blade or the current coil. The bifilar winding includes two closely spaced parallel windings. The transformer can be an existing transformer within the electric meter, for example, a transformer configured to measure a current flowing through the current coil.

The bifilar windings can be interconnected in either parallel or series. For example, in a series configuration, the start lead of the first winding is connected to the start lead of the second winding, the finish lead of the first winding is connected to the voltage source, and the finish lead of the second winding is connected to a sense resistor. By contrast, in a parallel configuration, the bifilar windings are configured such that a start lead of a first winding and a finish lead of a second winding are connected to a voltage source, and a finish lead of the first winding and a finish lead of the second winding are connected to a sense resistor.

Technical advantages of the present disclosure include more frequent temperature measurements and more accurate current measurements without requiring a temperature sensor. For example, by applying a direct current (DC) voltage to a secondary winding, previous solutions can cause saturation and/or distortion of a measurement of current flowing through a sense resistor, thereby reducing an accuracy of the temperature measurements derived therefrom. Additional advantages include an ability to constantly apply a bias voltage, due to the magnetic fields of the bifilar windings canceling each other out.

Figure 1:
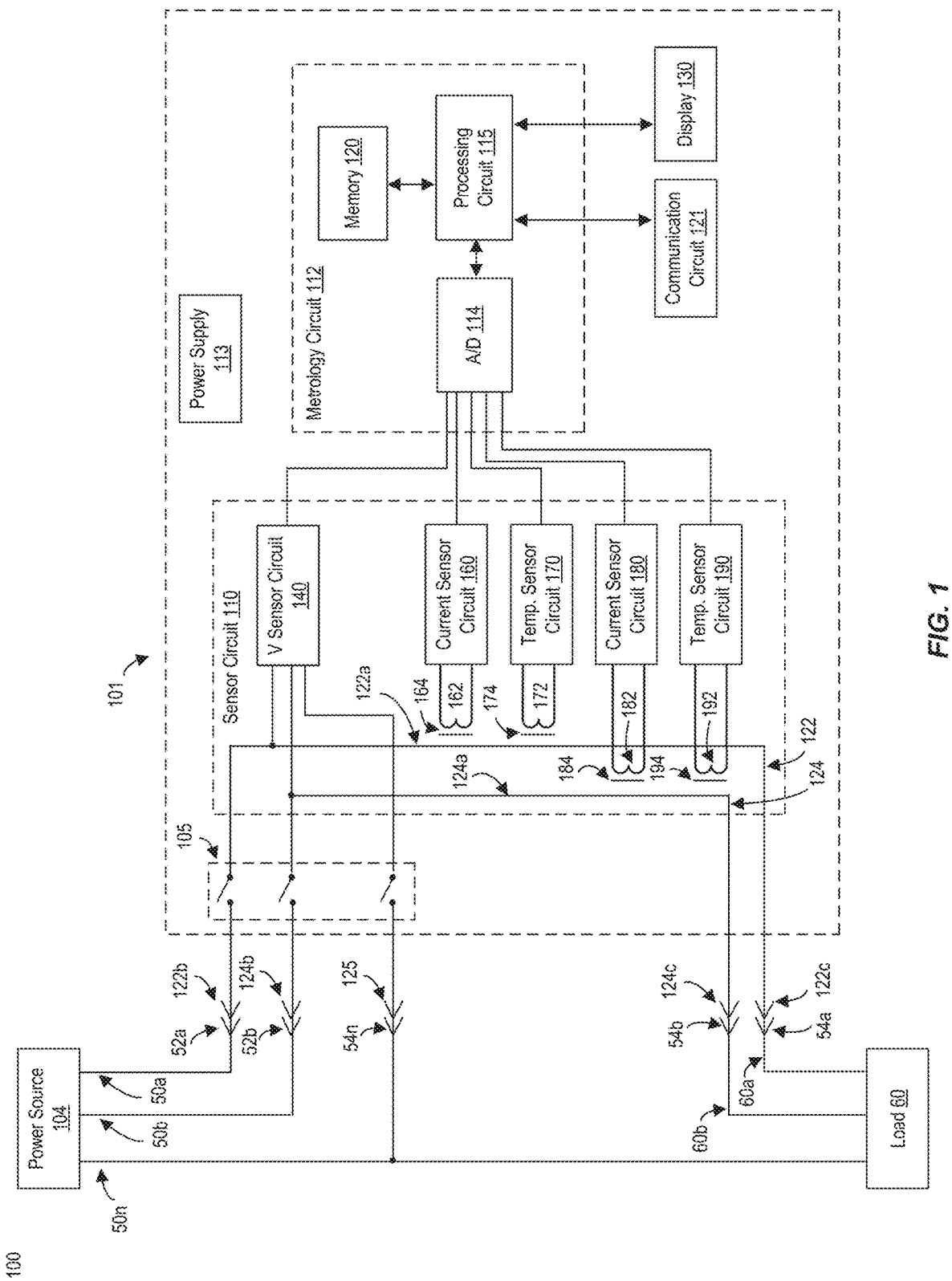
FIG. 1 is a schematic block diagram of an exemplary metering system, according to an aspect of the present disclosure.

Turning now to the Figures, FIG. 1 is a schematic block diagram of an exemplary metering system, according to an aspect of the present disclosure. FIG. 1 depicts metering environment 100, which includes power lines 50a-n, load 60, meter 101, and power source 104. In the example depicted in FIG. 1, power lines 50a-n deliver power from power source 104 to load 60 via meter 101, which performs various instrumentation including voltage current measurement, current measurement, and temperature measurement.

FIG. 1 depicts three power lines, two lines corresponding to a respective phase: 50a and 50b and a neutral line 50n. But meter 101 can have any number of phases. For example, meter 101 may be adapted to meters that connect to various other standard power line configurations associated with standard electrical service, including but not limited to, multiphase electrical service and single phase residential services.

Power lines 50a and 50b are provided to meter 101 for measurement. Power lines 50a, 50b connect to a meter mounting device or socket having jaws 52a, 52b, 54a, 54b, and 54n. Specifically, the power lines 50a, 50b are electrically coupled to the jaws 52a, 52b, and the neutral line 50n is electrically coupled to the jaw 54n. The jaws 54a, 54b are electrically coupled to the connections 60a and 60b of the load 60. The neutral line 50n is also coupled to the load 60. The jaws 52a, 52b, 54a, 54b, and 54n can be spring-loaded conductive receptacles that are configured to receive meter blades.

Meter 101 includes one or more of service switch 105, sensor circuit 110, metrology circuit 112, power supply 113, communication circuit 121, and display 130. Sensor circuit 110 is configurable to measure voltage, current, and/or temperature. For example, as depicted, sensor circuit includes voltage sensor circuit 140, current sensor circuits 160 and 180, and temperature sensor circuits 170 and 190. Measurement signals generated by sensor circuit 110 are analog signals having respective waveforms representative of the voltage and current provided to the load. The measurement signals are passed to metrology circuit 112.

Service switch 105 is configured to enable or disable the connection of power lines 50a-n to meter 101. Service switch 105 is a relay that is controllable by processing circuit 115. Processing circuit 115 can cause service switch 105 to enable or disable the connection of the power lines 50a-n. In this manner, a utility can enable or disable power remotely.

Meter 101 also includes current coils 122 and 124, which can be partially internal to the meter 101. The current coil 122 includes a body 122a of conductive metal, such as a copper bar, that terminates at either end in blades 122b and 122c. When the meter 101 is properly installed in a meter mounting device, the blade 122b is received by the jaw 52a, and the blade 122c is received by the jaw 54a. Thus, electricity may flow from the power line 50a to the load 60 via the jaw 52a, the current coil 122, the jaw 54a, and connection 60a. The blades 122b, 122c are generally disposed external to a housing, while the body 122a of the current coil 122 extends through the interior of a housing.

Similarly, the current coil 124 includes a body 124a of conductive metal, such as a copper bar, that terminates at either end in blades 124b and 124c. When the meter 101 is properly installed, the blade 124b is received by the jaw 52b, and the blade 124c is received by the jaw 54b. Thus, electricity may flow from the power line 50b to the load 60 via the jaw 52b, the current coil 124, the jaw 54b, and the connection 60b. The blades 124b, 124c are generally external to the housing, while the body 124a of the current coil 124 extends through the interior of the housing. Neutral line 50n is coupled into the meter via blade 125.

Temperature sensor circuits 170 and 190 are configured to identify phenomena indicative of a hot socket condition, including those in which a temperature of the meter 101 exceeds a threshold temperature level. Temperature sensor circuit 170 is configured to measure a temperature of current coil 122 (supplied with a first phase of electricity) and temperature sensor circuit 190 is configured to measure a temperature of current coil 124 (supplied with a second phase of electricity). Thus, in a poly phase system, more than one temperature sensor circuit may be employed, for example, one temperature sensor circuit per phase.

More specifically, temperature sensor circuit 170 is connected to winding 172 about core 174. Core 174 is the same core as discussed with respect to current sensor circuit 160, for example, a core that is disposed in a current sensing relationship with current coil 122. Winding 172 is a bifilar winding, that is two parallel windings about core 174. Further details are discussed with respect to FIGS. 2 and 4. Similarly, temperature sensor circuit 190 is connected to winding 192 about core 194. Core 194 can be identical to core 184 as discussed with respect to current sensor circuit 180, for example, a core that is disposed in a current sensing relationship with current coil 124. Winding 192 is bifilar winding, that is two windings about core 194. Example implementations of temperature sensor circuit 170 and 190 are discussed with respect to FIGS. 2 and 4.

If temperature sensor circuit 170 and/or 190 detect a hot socket condition, the meter 101 can be configured to send an alert signal to a remote device so that mitigating steps can be taken to prevent or to minimize damage to the meter 101 and to prevent or to minimize service disruptions to the load 60. Mitigating steps can include remotely causing service switch 105 to disconnect service.

Current sensor circuit 160 is operable to detect a current flowing on current coil 122. Current sensor circuit 160 includes a winding 162, which is disposed about a core 164. Core 164 can be part of a current transformer that is disposed in a current sensing relationship with current coil 122. Current sensor circuit 180 is operable to detect a current flowing on current coil 124. Current sensor circuit 180 includes a winding 182, which is disposed about a core 184. Core 184 can be part of a current transformer that is disposed in a current sensing relationship with current coil 124.

Metrology circuit 112 includes an analog to digital (A/D) converter 114, and a processing circuit 115. Processing circuit 115 can be part of a commercially available chip package that includes the A/D converter 114, the memory 120, and/or other support devices. The A/D converter 114 may be any suitable analog-to-digital converter that is configured to sample the analog measurement signals generated by the sensor circuit 110. The A/D converter 114 is operably coupled to provide the resulting digital measurement signals to the processing circuit 115.

Processing circuit 115 includes a processing device configured to execute program instructions stored in the memory to carry out the various functions described herein, as well as other metering functions. The processing circuit 115 is operably coupled to receive the digital measurement signals from the A/D converter 114 and generate voltage measurements, current measurements, temperature measurements, or energy consumption data therefrom. An example of a process used to generate temperature measurements is described with respect to FIG. 6. Processing circuit 115 can include digital processing circuitry that processes the digitized measurement signals to thereby generate energy consumption data, power consumption data, voltage data, current data, or temperature data. Processing circuit 115 may also include the functions of a controller and/or a digital signal processor. Processing circuit 115 can also suitably include general control and supervisory processing circuitry, which is not shown in detail. The processing circuit 115 communicates information with external devices with serial input and output ports, not shown, or communication circuits, also not shown.

Memory 120 includes one or more storage devices of different types. Memory 120 may include volatile or non-volatile random access memory, read-only memory, or other readable and/or writeable memory device. The memory 120 stores instructions and/or parameters used by the processing circuit 115 to carry out the operations described herein, and may further store energy consumption data. Memory 120 can include a non-transitory computer readable medium.

Communication circuit 121 is operably coupled to communicate information with the processing circuit 115, as well as at least one external device. To this end, the communication circuit 121 may include an optical transceiver located at a translucent or transparent optical port, not shown. The communication circuit 121 may also include a remote communication circuit, such as a power line modem, a Radio-Frequency (RF) transceiver, for example, a pager radio, or other wireless device that is capable of transmitting on a Wide Area Network (WAN), or on another wireless communication network, or a cellular radio.

Display 130 is any display suitable to output information about the meter 100 such as a Liquid Crystal Display (LCD), Light Emitting Diode (LED) display, or touch-screen. For example, information could include an operational status of meter 100, for example metering or network status, or consumption information.

Figure 2:
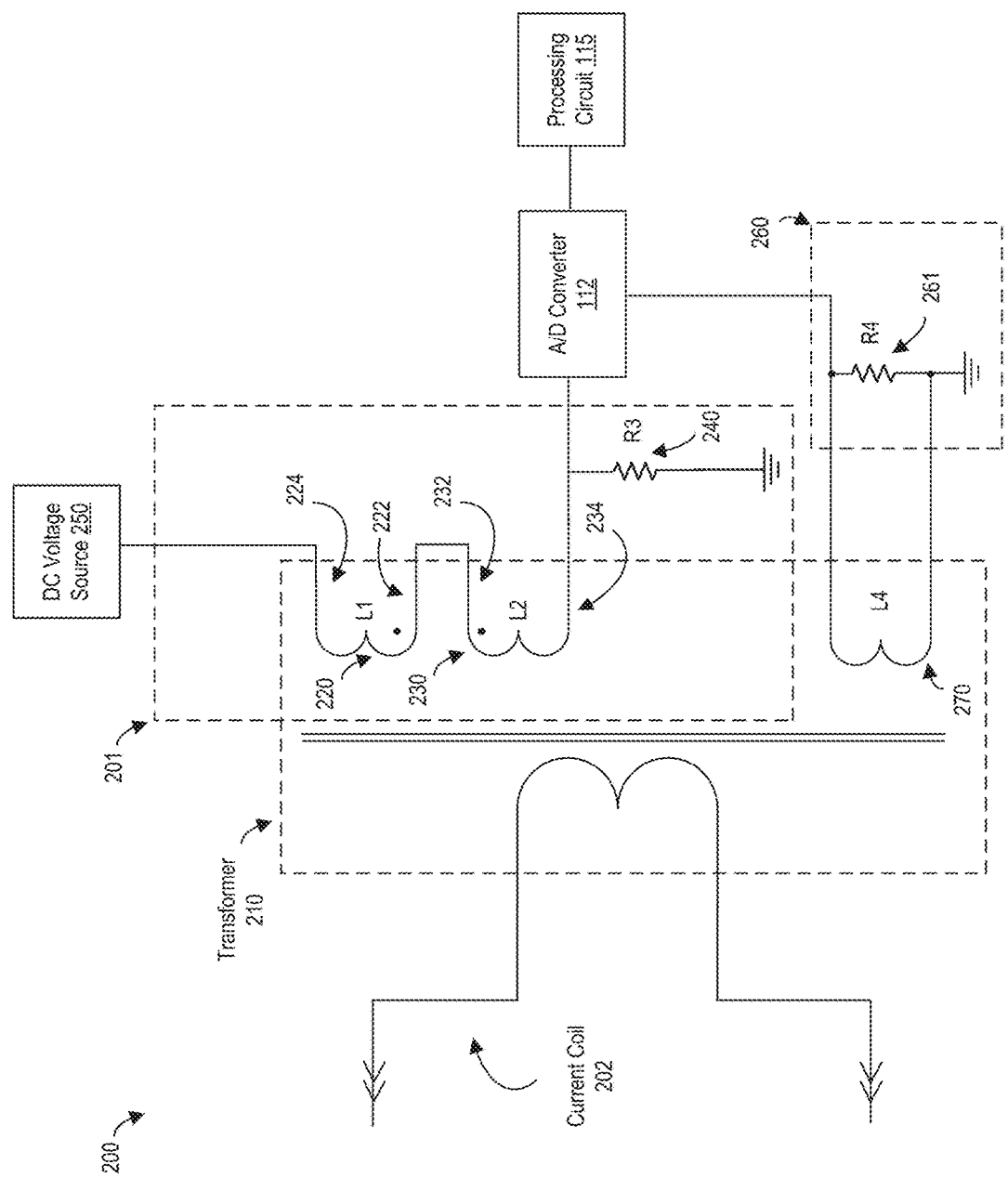
FIG. 2 is a schematic diagram of an exemplary temperature sensor circuit with a bifilar winding with windings connected in series, according to an aspect of the present disclosure.

FIG. 2 is a schematic diagram of an exemplary temperature sensor circuit with a bifilar winding with windings connected in series, according to an aspect of the present disclosure. FIG. 2 depicts meter environment 200, which includes temperature sensor circuit 201, current coil 202, transformer 210, A/D converter 114, processing circuit 115, DC voltage source 250, and current sensor circuit 260. The DC voltage source 250 may be provided by the meter's power supply or from another component within the meter. Temperature sensor circuit 201 is an example implementation of temperature sensor circuit 170 or 190.

Temperature sensor circuit 201 includes first bifilar winding 220, second bifilar winding 230, and sense resistor 240. First bifilar winding 220 includes a start lead 222 and a finish lead 224. Second bifilar winding 230 includes a start lead 232 and a finish lead 234. First bifilar winding 220 and second bifilar winding 230 are identical in length and are wound around a core of transformer 210 such that start lead 222 and start lead 232 are at a first end of the transformer and finish lead 224 and finish lead 234 are at a second end of the transformer.

Transformer 210 is disposed in a current sensing relationship with current coil 202, which is the primary winding. Transformer 210 includes the first bifilar winding 220 and the second bifilar winding 230, which are secondary windings as well as current sensor winding 270, which is also a secondary winding. Current sensor winding 270 is used by current sensor circuit 260 to sense current flow on current coil 202. Current sensor circuit 260 includes sense resistor 261.

As depicted, first bifilar winding 220 and second bifilar winding 230 are in a series configuration. Start lead 222 is connected to start lead 232. Finish lead 224 is connected to DC voltage source 250. Finish lead 234 is connected to a first end of sense resistor 240 and to an input of A/D converter 114. A second end of the sense resistor 240 is connected to ground.

In an alternate configuration (not depicted), finish lead 224 is connected to finish lead 234. In this configuration, start lead 222 is connected to DC voltage source 250, start lead 232 is connected to a first end of sense resistor 240, and a second end of sense resistor 240 is connected to ground.

First bifilar winding 220 has an inherent resistance R1, second bifilar winding 220 has an inherent resistance R2, and sense resistor has resistance R3. In some cases, the resistance of the sense resistor R3 is greater than the inherent resistance of the windings of the bifilar winding. In one example, the inherent resistance of each of the bifilar windings is 100 Ohm, the resistance of the sense resistor is 200 Ohm, an inherent impedance L1 of the first bifilar winding 220 is 50 Henrys and an inherent impedance L2 of the second bifilar winding L2 is 50 Henrys.

As the temperature of the current coil (the primary winding) changes, the measured voltage across the sense resistor R3 changes because the temperature coefficient of resistivity (or temperature coefficient) of the first and second bifilar windings differs from the temperature coefficient of resistivity of the sense resistor. In one example, the temperature coefficient of the sense resistor is smaller than the temperature coefficient of each of the bifilar winding. Examples of temperature coefficients include 0.00393 for each of the bifilar windings and 0.0001 for the sense resistor.

When a voltage is applied by DC voltage source 250, A/D converter 114 receives a signal indicating a voltage across sense resistor 240. In one example, the DC voltage source provides approximately 3.3 Volts to the finish lead of the first bifilar winding. The A/D converter converts the signal to a digital output. Processing circuit 115 receives the digital output signal from the A/D converter 114, and uses the digital signal to determine a temperature value. The voltage level provided by the DC voltage source and the size of the sense resistor may be selected based on the requirements of the A/D converter. Some implementations select the voltage and resistance so that the input to the A/D converter is at the middle of the range of the A/D converter when the current coil is operating at an expected normal operating temperature. As the temperature of the current coil changes, the measured voltage at the sense resistor changes. Therefore, the measured voltage indicates the temperature, as illustrated by FIG. 3.

Figure 3:
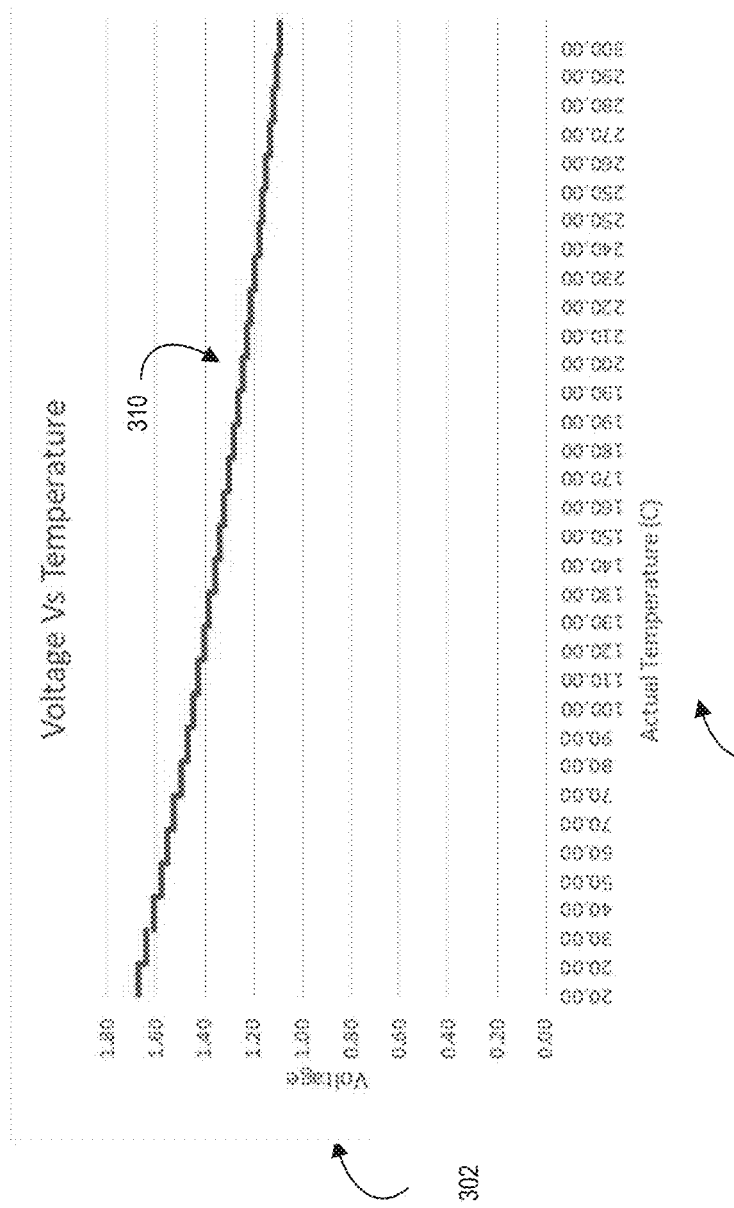
FIG. 3 is a graph illustrating a relationship between a measured voltage versus temperature, in accordance with an aspect of the present disclosure.

FIG. 3 is a graph illustrating a relationship between a measured voltage versus temperature, in accordance with an aspect of the present disclosure. FIG. 3 depicts graph 300, which includes plot 310. Plot 310 depicts sensed voltage 302 versus temperature 301. As can be seen, the sensed voltage decreases as temperature increases.

Figure 4:
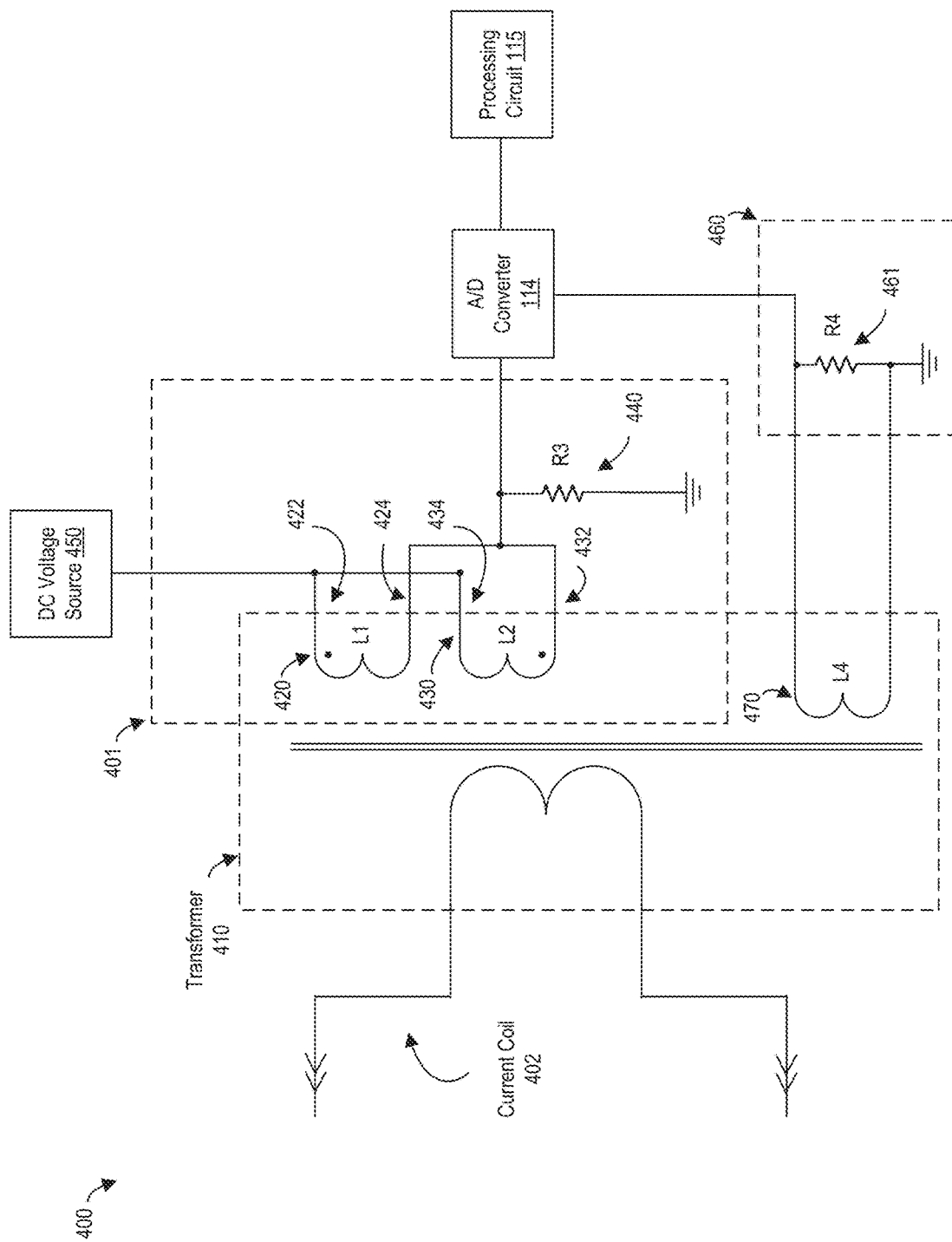
FIG. 4 is a schematic diagram of an exemplary temperature sensor circuit with a bifilar winding with windings connected in parallel, according to an aspect of the present disclosure.

FIG. 4 is a schematic diagram of an exemplary temperature sensor circuit with a bifilar winding with windings connected in parallel, according to an aspect of the present disclosure. FIG. 4 depicts meter environment 400, which includes temperature sensor circuit 401, current coil 402, transformer 410, A/D converter 114, processing circuit 115, and DC voltage source 450, and current sensor circuit 460. The DC voltage source 450 may be provided by the meter's power supply or from another component within the meter. Temperature sensor circuit 401 is an example implementation of temperature sensor circuit 170 or 190.

Temperature sensor circuit 401 includes first bifilar winding 420, second bifilar winding 430, and sense resistor 440. First bifilar winding 420 includes a start lead 422 and a finish lead 424. Second bifilar winding 430 includes a start lead 432 and a finish lead 434. First bifilar winding 420 and second bifilar winding 430 are identical in length and are wound around a core of transformer 410 such that start lead 422 and start lead 432 are at a first end of the transformer and finish lead 424 and finish lead 434 are a at a second end of the transformer.

Transformer 410 is disposed in a current sensing relationship with current coil 402, which is the primary winding and includes the first bifilar winding 420 and the second bifilar winding 430, which are secondary windings, as well as current sensor winding 470, which is also a secondary winding. Current sensor winding 470 is used by current sensor circuit 460 to sense current flow on current coil 402. Current sensor circuit 460 includes sense resistor 461.

First bifilar winding 420 and second bifilar winding 430 are connected in parallel. Start lead 422 and finish lead 434 are connected to each other and connected to DC voltage source 450. Finish lead 424 and start lead 432 are connected to sense resistor 440, which is in turn connected to ground. Finish lead 424 and start lead 432 are also connected to an input of A/D converter 114. In this manner, the first bifilar winding 420 and second bifilar winding 430 are oriented to cause opposite but equal magnetic fields. Therefore, a magnetic field caused by current flowing in first bifilar winding 420 cancels out a magnetic field caused by current flowing in second bifilar winding 430, resulting in zero net flux on the core and a very small influence on accuracy of current measurement as performed by current sensor circuit 460.

First bifilar winding 430 has an inherent resistance R1, second bifilar winding 440 has an inherent resistance R2, and sense resistor has resistance R3. In some cases, the resistance of the sense resistor R3 is greater than the inherent resistance of the windings of the bifilar winding. In one example, the inherent resistance of each of the bifilar windings is 10,000 Ohm, the resistance of the sense resistor is 5,000 Ohm, an inherent impedance L1 of the first bifilar winding 420 is 100 Henrys and an inherent impedance L2 of the second bifilar winding 430 is 100 Henrys.

As the temperature of the current coil (the primary winding) changes, the measured voltage across the sense resistor R3 changes because the temperature coefficient of resistivity (or temperature coefficient) of the first and second bifilar windings differs from the temperature coefficient of resistivity of the sense resistor. In one example, the temperature coefficient of the sense resistor is smaller than the temperature coefficient of each of the bifilar winding. Examples of temperature coefficients include 0.00393 for each of the bifilar windings and 0.001 for the sense resistor.

When a voltage is applied by DC voltage source 450, A/D converter 114 receives a signal indicating a voltage across sense resistor 440. In one example, the DC voltage source provides approximately 3.3 Volts to the start lead of the first bifilar winding. The A/D converter converts the signal to a digital output. Processing circuit 115 receives the digital output signal from the A/D converter 114, and uses the digital signal to determine a temperature value. The voltage level provided by the DC voltage source and the size of the sense resistor may be selected based on the requirements of the A/D converter. Some implementations select the voltage and resistance so that the input to the A/D converter is at the middle of the range of the A/D converter when the current coil is operating at an expected normal operating temperature. As the temperature of the current coil changes, the measured voltage at the sense resistor changes. Therefore, the measured voltage indicates the temperature, as illustrated by FIG. 5.

Figure 5:
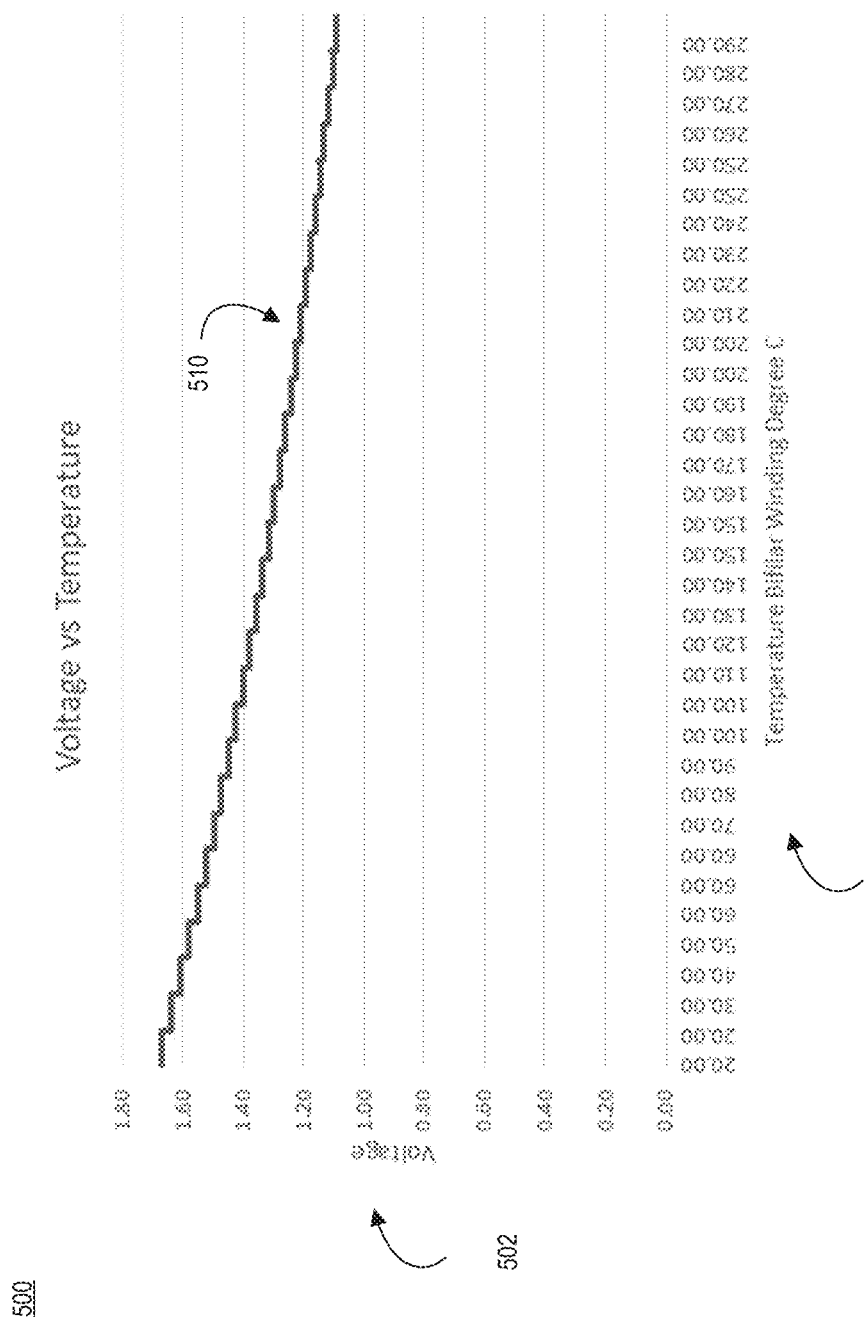
FIG. 5 is a graph illustrating a relationship between a measured voltage versus temperature, in accordance with an aspect of the present disclosure.

FIG. 5 is a graph illustrating a relationship between a measured voltage across the sense resistor versus temperature, in accordance with an aspect of the present disclosure. FIG. 5 depicts graph 500, which includes plot 510. Plot 510 depicts sensed voltage 502 versus temperature 501. As can be seen, the sensed voltage decreases as temperature increases.

Figure 6:
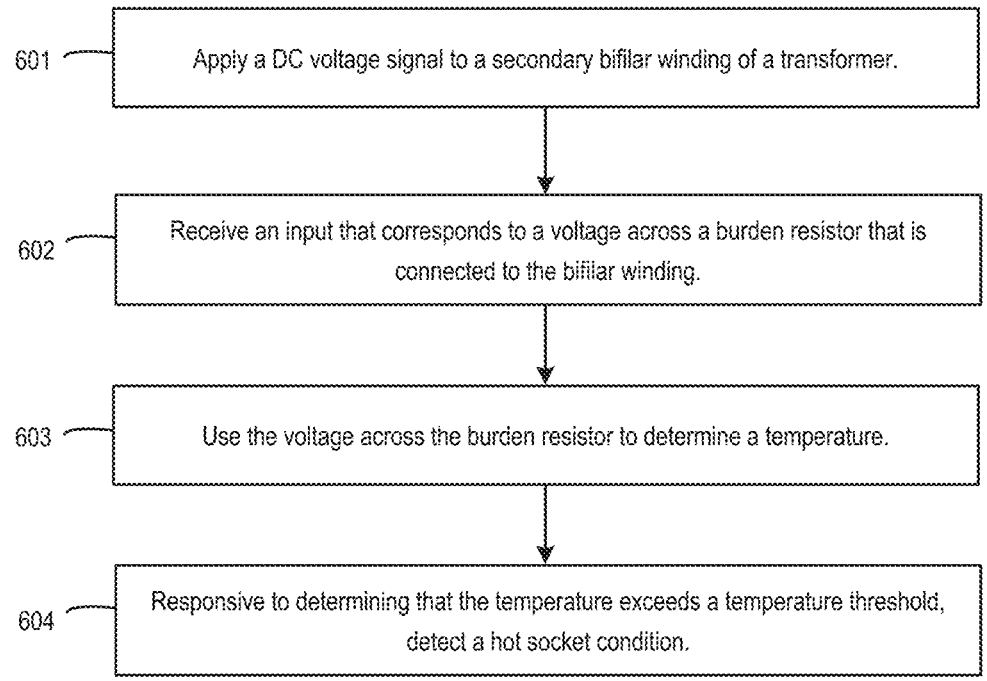
FIG. 6 is a flowchart depicting an example of a process for deriving a temperature of a current coil, in accordance with an aspect of the present disclosure.

FIG. 6 is a flowchart depicting an example of a process for deriving a temperature of a current coil, in accordance with an aspect of the present disclosure. FIG. 6 is discussed with respect to the circuit illustrated by FIG. 2 for illustration purposes, but can also be performed with the circuit illustrated by FIG. 4.

At block 601, process 600 involves applying a direct current (DC) voltage signal to secondary bifilar winding of a transformer. Using FIG. 2 as an example, processing circuit 115 causes a DC voltage from DC voltage source 250 to be applied first bifilar winding 220 and second bifilar winding 230. As long as meter 101 is powered, processing circuit 115 can provide power to the DC voltage source 250, which in turn provides power to the bifilar winding.

At block 602, process 600 involves receiving an input that corresponds to a voltage across a sense resistor that is connected to the bifilar winding. A/D converter 114 receives a signal indicating the voltage across sense resistor 240.

At block 603, process 600 involves using the voltage across the sense resistor to determine a temperature. Processing circuit 115 receives, from A/D converter 114, a digitized voltage representing the voltage across the sense resistor and converts the digitized voltage to temperature. Processing circuit 115 can use a predefined ratio or scale between voltage and temperature (for example, as depicted in FIG. 3).

At block 604, process 600 involves a responsive to determining that the temperature exceeds a temperature threshold and detecting a hot socket condition. When the temperature is greater than a temperature threshold, then processing circuit 115 can identify a hot socket condition. In response, processing circuit 115 can perform an action such as causing communication circuit 121 to transmit a message to a head end system or disconnecting service switch 105.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A meter comprising:
   a current transformer including a primary winding, a secondary winding and a secondary bifilar winding, wherein the primary winding corresponds to a current coil, the secondary bifilar winding includes a first bifilar winding and a second bifilar winding connected in series, and a start lead of the first bifilar winding is connected to a start lead of the second bifilar winding;
   a DC voltage source configured to generate a DC voltage signal, wherein the DC voltage signal generated by the DC voltage source is provided to a finish lead of the first bifilar winding as long as the meter is powered;
   a first sense resistor connected between a finish lead of the second bifilar winding and ground, wherein a temperature coefficient of the first sense resistor is less than a temperature coefficient of a resistivity of a material of the first bifilar winding and the second bifilar winding; and
   a processing circuit configured to:
      receive an input that corresponds to a voltage across the first sense resistor;
      use the voltage across the first sense resistor to determine a temperature associated with the current coil; and
      when the temperature exceeds a temperature threshold, detect a hot socket condition.

2. The meter of claim 1, further comprising an A/D converter, wherein an input of the A/D converter is connected to the first sense resistor and an output of the A/D converter is connected to the processing circuit and provides the input that corresponds to the voltage across the first sense resistor.

3. The meter of claim 1, further comprising:
   a second sense resistor connected between the secondary winding and ground,
   wherein the processing circuit is further configured to:
      receive an input that corresponds to a voltage across the second sense resistor; and
      use the voltage across the second sense resistor to determine a current associated with the current coil.

4. The meter of claim 1, wherein a resistance of the first sense resistor is greater than a resistance of the first bifilar winding and the second bifilar winding.

5. The meter of claim 1, further comprising a communication circuit, wherein the processing circuit is further configured to communicate a message indicating the hot socket condition to a remote system via the communication circuit.

6. The meter of claim 5, further comprising a service switch that controls a connection of the meter to a power source, wherein the processing circuit is further configured to control the service switch to disconnect the meter from the power source in response to receiving a message including a disconnect command via the communication circuit.

7. The meter of claim 1, wherein the current coil corresponds to a first phase and a second current coil corresponds to a second phase, further comprising:
   a second current transformer including a primary winding, a secondary winding and a secondary bifilar winding, wherein the primary winding of the second current transformer corresponds to the second current coil, and the secondary bifilar winding of the second current transformer includes a first bifilar winding and a second bifilar winding; and
   a third sense resistor connected between a finish lead of the second bifilar winding of the second current transformer and ground,
   wherein the processing circuit is configured to:
      receive an input that corresponds to a voltage across the third sense resistor;
      use the voltage across the third sense resistor to determine a temperature associated with the second current coil; and
      when the temperature exceeds the temperature threshold, detect the hot socket condition.

8. A meter comprising:
a current transformer including a primary winding, a secondary winding and a secondary bifilar winding, wherein the primary winding corresponds to a current coil, the secondary bifilar winding includes a first bifilar winding and a second bifilar winding connected in parallel, and a finish lead of the first bifilar winding is connected to a start lead of the second bifilar winding;
a DC voltage source configured to generate a DC voltage signal, wherein the DC voltage signal generated by the DC voltage source is provided to the start lead of the first bifilar winding and the finish lead of the second bifilar winding as long as the meter is powered;
a first sense resistor connected between a finish lead of the first bifilar winding and a start lead of the second bifilar winding and ground,
wherein a temperature coefficient of the first sense resistor is less than a temperature coefficient of a resistivity of a material of the first bifilar winding and the second bifilar winding; and
a processing circuit configured to:
receive an input that corresponds to a voltage across the first sense resistor;
use the voltage across the first sense resistor to determine a temperature associated with the current coil; and
when the temperature exceeds a temperature threshold, detect a hot socket condition.

9. The meter of claim 8, further comprising an A/D converter, wherein an input of the A/D converter is connected to the first sense resistor and an output of the A/D converter is connected to the processing circuit and provides the input that corresponds to the voltage across the first sense resistor.

10. The meter of claim 8, further comprising:
a second sense resistor connected between the secondary winding and ground,
wherein the processing circuit is further configured to:
receive an input that corresponds to a voltage across the second sense resistor; and
use the voltage across the second sense resistor to determine a current associated with the current coil.

11. The meter of claim 8, wherein a resistance of the first sense resistor is greater than a resistance of the first bifilar winding and the second bifilar winding.

12. The meter of claim 8, further comprising a communication circuit, wherein the processing circuit is further configured to communicate a message indicating the hot socket condition to a remote system via the communication circuit.

13. The meter of claim 12, further comprising a service switch that controls a connection of the meter to a power source, wherein the processing circuit is further configured to control the service switch to disconnect the meter from the power source in response to receiving a message including a disconnect command via the communication circuit.

14. The meter of claim 8, wherein the current coil corresponds to a first phase and a second current coil corresponds to a second phase, further comprising:
a second current transformer including a primary winding, a secondary winding and a secondary bifilar winding, wherein the primary winding of the second current transformer corresponds to the second current coil and the secondary bifilar winding of the second current transformer includes a first bifilar winding and a second bifilar winding; and
a third sense resistor connected between a finish lead of the second bifilar winding of the second current transformer and ground,
wherein the processing circuit is configured to:
receive an input that corresponds to a voltage across the third sense resistor;
use the voltage across the third sense resistor to determine a temperature associated with the second current coil; and
when the temperature exceeds the temperature threshold, detect the hot socket condition.

15. A meter comprising:
a current transformer including a primary winding, a secondary winding and a secondary bifilar winding, wherein the primary winding corresponds to a current coil, the secondary bifilar winding includes a first bifilar winding and a second bifilar winding, and a start lead of the first bifilar winding is connected to a start lead of the second bifilar winding;
a DC voltage source configured to generate a DC voltage signal, wherein the DC voltage signal generated by the DC voltage source is provided to a finish lead of the first bifilar winding as long as the meter is powered;
a first sense resistor connected between a finish lead of the second bifilar winding and ground, wherein a temperature coefficient of the first sense resistor is less than a temperature coefficient of a resistivity of a material of the first bifilar winding and the second bifilar winding;
an A/D converter connected between the first sense resistor and an input of a processing circuit; and
the processing circuit configured to:
receive a signal from the A/D converter that corresponds to a voltage across the first sense resistor;
use the signal from the A/D converter to determine a temperature associated with the current coil; and
when the temperature exceeds a temperature threshold, detect a hot socket condition.

16. The meter of claim 15, further comprising:
a second sense resistor connected between the secondary winding and ground,
wherein the processing circuit is further configured to:
receive an input that corresponds to a voltage across the second sense resistor; and
use the voltage across the second sense resistor to determine a current associated with the current coil.

17. The meter of claim 15, wherein a resistance of the first sense resistor is greater than a resistance of the first bifilar winding and the second bifilar winding.

18. The meter of claim 15, further comprising a communication circuit, wherein the processing circuit is further configured to communicate a message indicating the hot socket condition to a remote system via the communication circuit.

19. The meter of claim 18, further comprising a service switch that controls a connection of the meter to a power source, wherein the processing circuit is further configured to control the service switch to disconnect the meter from the power source in response to receiving a message including a disconnect command via the communication circuit.

* * * * *